United States Patent [19]  [11] 4,247,611
Sander et al.  [45] Jan. 27, 1981

[54] POSITIVE-WORKING RADIATION-SENSITIVE COPYING COMPOSITION AND METHOD OF USING TO FORM RELIEF IMAGES

[75] Inventors: Jürgen Sander, Kelkheim; Gerhard Buhr, Königstein; Hans Ruckert, Naurod, all of Fed. Rep. of Germany

[73] Assignee: Hoechst Aktiengesellschaft, Fed. Rep. of Germany

[21] Appl. No.: 899,271

[22] Filed: Apr. 24, 1978

[30] Foreign Application Priority Data

Apr. 25, 1977 [DE] Fed. Rep. of Germany ....... 2718254

[51] Int. Cl.² .................. G03C 1/68; G03C 1/70; G03C 1/52; G03F 7/00
[52] U.S. Cl. ................................. 430/286; 430/176; 430/192; 430/270; 430/292; 430/300; 430/302; 430/323; 430/914; 430/919; 430/925; 430/326; 204/159.15; 204/159.21; 204/159.23; 204/159.24
[58] Field of Search ............... 96/115 R, 115 P, 91 D, 96/91 R, 75, 33, 35, 35.1; 430/326, 286, 176, 192, 914, 919, 925, 270, 292, 300, 302, 303, 323; 204/159.15, 159.21, 159.23, 159.24

[56] References Cited

U.S. PATENT DOCUMENTS

| | | | |
|---|---|---|---|
| 2,892,712 | 6/1959 | Plambeck | 96/35.1 |
| 3,558,311 | 1/1971 | Delzenne et al. | 96/35.1 |
| 3,753,718 | 8/1973 | Lonczak | 96/88 |
| 3,779,778 | 12/1973 | Smith et al. | 96/35.1 |
| 3,915,704 | 10/1975 | Limburg et al. | 96/35.1 |
| 3,923,514 | 12/1975 | Marsh | 96/35.1 |
| 3,963,491 | 6/1976 | Marsh | 96/35.1 |
| 3,964,907 | 6/1976 | Marsh | 96/35.1 |
| 3,984,253 | 10/1976 | Nelson | 430/270 |
| 3,991,033 | 11/1976 | Sam | 430/270 |
| 3,998,712 | 12/1976 | Hickmann et al. | 96/35.1 |
| 4,007,209 | 2/1977 | Hickmann et al. | 96/35.1 |
| 4,101,323 | 7/1978 | Buhr et al. | 96/35 |
| 4,108,839 | 8/1978 | Chambers et al. | 96/35.1 |
| 4,131,465 | 12/1978 | Petropoulos | 430/326 |
| 4,150,989 | 4/1979 | Chambers et al. | 430/302 |

OTHER PUBLICATIONS

Fieser and Fieser, "Advanced Organic Chemistry," 1961, pp. 441 and 442.
Grant, J., "Hackh's Chemical Dictionary," 4th Ed., 1969, McGraw-Hill Book Co., pp. 5 and 371.

Primary Examiner—Charles L. Bowers, Jr.
Attorney, Agent, or Firm—James E. Bryan

[57] ABSTRACT

This invention relates to a radiation-sensitive copying composition which comprises (a) a compound which forms an acid under the influence of actinic radiation, and (b) an organic polymeric compound which contains recurrent acetal or ketal groupings in its main chain and whose solubility in a liquid developer is increased by the action of an acid, each α-carbon atom of the alcoholic constituent of the acetal or ketal grouping of the organic polymeric compound being aliphatic. The invention also relates to a process for the production of relief images using a radiation-sensitive copying composition.

14 Claims, No Drawings

POSITIVE-WORKING RADIATION-SENSITIVE COPYING COMPOSITION AND METHOD OF USING TO FORM RELIEF IMAGES

The present invention relates to a new radiation-sensitive composition which contains, as essential components, a) a compound which forms an acid under the influence of actinic radiation and b) an organic polymeric compound whose solubility in a developer liquid is increased by the action of an acid.

Positive-working light-sensitive copying materials, i.e. materials the copying layers of which become soluble in the exposed areas, are known. Above all, positive-working copying compositions based on o-quinone diazides have gained acceptance in practice.

Frequently, the light-sensitivity of these copying materials is not satisfactory. The light-sensitivity may be increased by using catalytically-acting light-sensitive systems, because in this case the quantum yield becomes greater than 1. Thus, the known principle of initiating secondary reactions by means of photolytically produced acids and thus causing the exposed areas to become soluble, has been recently utilized for positive-working systems. In these materials, photochemically produced strong acids are used for splitting low or high molecular weight acetals and O.N-acetals containing aromatic compounds as hydroxyl or amine constituents (U.S. Pat. No. 3,779,778) or for splitting orthoesters and amide acetals (German Offenlegungsschrift No. 2,610,842).

Furthermore, a combination of photochemical acid formers with certain polyaldehydes and polyketones also has been disclosed as a positive-working copying composition which yields visible images upon exposure (U.S. Pat. Nos. 3,915,704, 3,915,706, 3,917,483, and 3,932,514).

These compositions are not without disadvantages, however. The polyaldehydes and polyketones which, as the essential components determine the quality of the recording materials containing them, are not readily accessible to changes in their material properties by which they might be adapted to practical requirements.

Despite their catalytic operation, the practical light-sensitivity of the copying compositions containing the above-mentioned acetals and O.N-acetals is not satisfactory. Moreover, many of the above-mentioned acetals, O.N-acetals and o-esters are not easily accessible.

It is the object of the present invention to provide a new, positive-working light-sensitive copying composition which possesses high sensitivity to actinic radiation, especially short-wave light and electron beams, and is readily available.

The present invention relates to a radiation-sensitive copying composition which comprises, as essential components, (a) a compound which forms an acid under the influence of actinic radiation and (b) an organic polymeric compound which contains recurrent acetal or ketal groupings in its main chain and whose solubility in a developer liquid is increased by the action of an acid. In the copying composition according to the invention each α-carbon atom of the alcoholic constituent of the acetal or ketal groupings of the organic polymeric compound is aliphatic.

In connection with this application, the term "actinic radiation" means any radiation whose energy at least corresponds to that of short-wave visible light. Long-wave ultraviolet radiation is particularly suitable, and so are electron and laser beams.

Suitable liquid developers are especially aqueous solutions, preferably weakly alkaline solutions, but organic solvents, which may, if desired, be mixed with water or with aqueous solutions, also may be used.

The term "alcoholic constituent," in particular, means that part of the recurrent unit of the polymer which is derived from an alcohol, preferably a multivalent alcohol. The term, however, also covers that part of a hydroxy alkyl carbonyl compound or a unit derived therefrom which carries one or more alcoholic OH groups, as will be explained below in greater detail.

"Alcoholic OH groups" in the sense used in the present application are only those groups of which not more than one is attached to a saturated aliphatic carbon atom. It is essential for the carbon atoms in the α-position, each of which is connected to one oxygen atom only of the acetal or ketal group, to be saturated aliphatic or cycloaliphatic carbon atoms.

Among the polymeric compounds containing recurrent acetal and/or ketal groupings, those are preferred which are obtained by reaction of aldehydes and/or ketones (or their synthetic equivalents) with bivalent alcohols, with polyaddition and/or polycondensation, polymeric compounds containing units of the general formula I being particularly preferred:

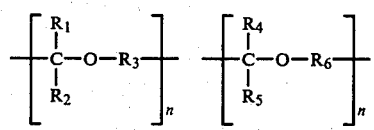

in this formula
- n—is an integer from 1 to 40, preferably between 1 and 20,
- $R_1$ and $R_4$—are H, alkyl groups, preferably with 1 to 12 carbon atoms, or aryl groups and
- $R_3$ and $R_6$—are alkylene oxy groups with at least 2, preferably 2 to 18, and most advantageously 4 to 18 carbon atoms and
- $R_2$ and $R_5$—are alkyl groups, preferably with 1 to 12 carbon atoms, or aryl groups, and two of the groups $R_1$, $R_2$ and $R_3$ and two of the groups $R_4$, $R_5$ and $R_6$ may be connected with each other to form a substituted or unsubstituted ring, or alternatively,
- $R_3$ and $R_6$—are alkylene groups with at least 2, preferably from 2 to 18, and most advantageously 4 to 18 carbon atoms and
- $R_2$ and $R_5$—are alkoxy groups which are combined with $R_3$ and $R_6$ to form a substituted or unsubstituted, preferably 5- to 7-membered ring, and $R_3$ may be combined with $R_4$ and $R_1$ may be combined with $R_6$ of the neighboring unit to form substituted or unsubstituted rings.

Aryl groups are mono or multinuclear aromatic or heteroaromatic groups, normally with 6 to 20 carbon atoms, which may be substituted by alkyl, halogen, cyano, sulfonyl, acyl or carbalkoxy groups. Mononuclear aromatic groups, especially phenyl groups, are preferred.

Alkyl groups are branched or unbranched, saturated or unsaturated, cyclic or open chains which may be substituted by, possibly substituted, aryl, halogen, cyano, ester, aryloxy or alkoxy groups and may contain ether or keto groups.

Preferred alkylene groups are saturated or unsaturated, branched or unbranched, aliphatic and cycloaliphatic groups, which may be substituted by ester groups, alkoxy groups or aryloxy groups or may contain keto groups. Furthermore, individual members of the carbon chain may be replaced by hetero aroms, preferably oxygen. In each case, the terminal members of all alkylene groups should be saturated aliphatic or cycloaliphatic carbon atoms.

A special group among the polymeric compounds containing recurrent acetal groupings are the polycondensation products containing recurrent units of the general formula IIa which are obtained by reacting aldehydes $R_1CHO$ or acetals $R_1CH(OR_7)_2$ with diols $HOR_3OH$:

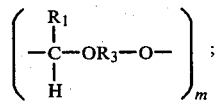

wherein
m is an integer from 2 to 80, preferably between 3 and 40,
$R_1$ is an alkyl group, preferably with 1 to 12 carbon atoms, or an aryl group,
$R_3$ is an alkylene group, preferably with 4 to 18 carbon atoms, which may be combined with $R_1$ to form a substituted or unsubstituted ring, and
$R_7$ is an alkyl group, preferably with 1 to 6 carbon atoms, especially a methyl or ethyl group.

Otherwise, the aryl, alkyl and alkylene groups have the meanings defined above.

If different aldehydes or acetals and/or diols are used, different units corresponding to formula IIa are obtained in a statistical arrangement. The statistical arrangement depends on the number of acetal-forming constituents and their relative amounts. In view of the easier availability of the aldehydes, as compared with acetals, aldehydes are preferred as the components forming polyacetals. A general account of the methods of preparing acetals is given, for example, in "Methoden der organischen Chemie" (Methods of Organic Chemistry) by Houben-Weyl, Volume IV/3.

The following compounds are examples of suitable aldehydes, or of aldehydes from which the acetals used as initial substances are derived: acetaldehyde, chloral, ethoxyacetaldehyde, benzyloxy acetaldehyde, phenyl acetaldehyde and diphenyl acetaldehyde, phenoxy acetaldehyde, propionic aldehyde, 2-phenyl and 3-phenyl-propionic aldehyde, isobutoxy and benzyloxy pivalic aldehyde, 3-ethoxypropanal, 3-cyano-propanal, n-butanal, iso-butanal, 3-chloro-butanal, 3-methoxy-butanal, 2,2-dimethyl-4-cyano-butanal, n-pentanal, 2- and 3-methyl-pentanal, 2-bromo-3-methyl-butanal, n-hexanal, 2- and 3-ethyl-butanal, 4-methyl-pentanal, cyclopentane carbaldehyde, n-heptanal, cyclohexane carbaldehyde, 1,2,3,6-tetrahydrobenzaldehyde, 3-ethylpentanal, 3- and 4-methyl-hexanal, n-octanal, 2- and 4-ethyl-hexanal, 3,5,5-trimethyl-hexanal, 4-methyl-heptanal, 3-ethyl-n-heptanal, decanal, the monohydroformylation product of dicyclopentadiene, dodecanal, crotonic aldehyde, benzaldehyde, 2-, 3- and 4-bromo-benzaldehyde, 2-, 3-, and 4-chloro-benzaldehyde, 2,4-dichloro- and 3,4-dichloro-benzaldehyde, 4-methoxy-benzaldehyde, 2,3-dimethoxy- and 2,4-dimethoxy-benzaldehyde, 2-, 3- and 4-fluoro-benzaldehyde, 2-, 3- and 4-methyl-benzaldehyde, 4-isopropyl-benzaldehyde, 3- and 4-tetrafluoroethoxy-benzaldehyde, 1- and 2-naphthaldehyde, furfural and thiophene-2-aldehyde.

Suitable bivalent aliphatic alcohols are, for example: Pentane-1,5-diol, n-hexane-1,6-diol, 2-ethyl-hexane-1,6-diol, 2,3-dimethyl-hexane-1,6-diol, heptane-1,7-diol, cyclohexane-1,4-diol, nonane-1,7-diol, nonane-1,9-diol, 3,6-dimethyl-nonane-1,9-diol, decane-1,10-diol, dodecane-1,12-diol, 1,4-bis-(hydroxy-methyl)cyclohexane, 2-ethyl-1,4-bis-(hydroxymethyl)-cyclohexane, 2-methyl-cyclohexane-1,4-diethanol, 2-methyl-cyclohexane-1,4-dipropanol, thio-dipropyleneglycol, 3-methyl-pentane-1,5-diol, dibutylene-glycol, hydroxypivalic acid-neopentylglycol ester, 4,8-bis-(hydroxymethyl)-tricyclodecane, n-butene-(2)-1,4-diol, n-but-2-yne-1,4-diol, n-hex-3-yne-2,5-diol, 1,4-bis-(2-hydroxy-ethoxy)-butyne-(2)- p-xylyleneglycol, 2,5-dimethyl-hex-3-yne-2,5-diol, bis-(2-hydroxyethyl)-sulfide, 2,2,4,4-tetramethyl-cyclobutane-1,3-diol, di-, tri-, tetra-, penta- and hexa-ethyleneglycol, di- and tripropyleneglycol and polyethyleneglycols with an average molecular weight of 200, 300, 400, and 600.

A further special group of polymeric compounds containing recurrent ketal groupings are the polycondensation products with recurrent units corresponding to the general formula IIb, which are obtained by reaction of ketals $R_1(R_2')C(OR_7)_2$ with diols $HOR_3OH$.

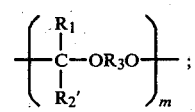

in this formula
m is an integer from 2 to 80, preferably between 3 and 40,
$R_1$ and $R_2'$ are alkyl groups, preferably with 1 to 12 carbon atoms, or aryl groups,
$R_3$ is an alkylene group, preferably with 4 to 18 carbon atoms, which may be combined with one of the groups $R_1$ and $R_2'$ to form a substituted or unsubstituted ring
$R_7$ is an alkyl group, preferably with 1 to 6 carbon atoms, most advantageously a methyl or ethyl group.

Moreover, $R_1$ and $R_2'$ may be part of a common ring which may be substituted. Aryl, alkyl and alkylene groups are those defined in connection with formula I. If different ketals and/or diols are used, different units corresponding to formula IIb are obtained in a statistical arrangement. The statistical arrangement depends on the number of ketal-forming constituents and their relative amounts. The ketals used as initial compounds may be prepared analogously to the acetals defined by formula IIa. Suitable diols are those listed in connection with formula IIa, for example.

The ketals may be derived from the following ketones, for example: phenyl acetone, 1,3-diphenyl-acetone, 2,2-diphenyl-acetone, chloro- and bromoacetone, benzyl acetone, butan-2-one, benzyl-propyl ketone, ethyl benzyl ketone, benzyl methyl ketone, 5-methylhexan-2-one, 2-methyl-pentan-2-one, 2-methyl-pentan-3-one, hexan-2-one, hexan-3-one, pentan-3-one, 2-methyl-butan-3-one, 2,2-dimethyl-butan-3-one, 5-methyl-heptan-3-one, octan-3-one, octan-4-one, octan-2-one, nonan-2-one, nonan-3-one, nonan-5-one, heptan-2-one, heptan-3-one, heptan-4-one, undecan-5-one, undecan- 6-one, dodecan-2-one, dodecan-3-one, dinonyl-ketone, undecan-4-one, undecan-2-one, tridecan-2-one, tridecan-3-one, dodecan-5-one, dioctylketone, 2-methyl-octan-3-one, cyclopropyl methyl ketone, decan-2-one, decan-3-one, decan-4-one, methyl-α-naphthyl-ketone, didecyl ketone, diheptyl ketone, dihexyl ketone, 3-fluoro-4-methoxy-acetophenone, acetophenone, 4-chloro-acetophenone, 2,5-dichloroacetophenone, 4-bromo-acetophenone, 2,4-dimethyl-acetophenone, 2-, 3-, and 4-fluoroacetophenone, desoxy benzoin, 2-, 3- and 4-methoxy-acetophenone, 2-, 3- and 4-methyl-acetophenone, propiophenone, 2-bromo-propiophenone, 4-fluoro-propiophenone, 4-methoxy-propiophenone, butyrophenone, 4-chloro-butyrophenone, valerophenone, benzophenone, 4-chloro-benzophenone, 4,4'-dichloro-benzophenone, 2,5-dimethyl-benzophenone, 3,4-dimethyl-benzophenone, 2- and 4-fluoro-benzophenone, 4-methoxy-benzophenone, cyclohexanone, 2-phenyl-cyclohexanone, 2-, 3- and 4-methyl-cyclohexanone, 2,6-dimethyl-cyclohexanone, 4-t-butyl-cyclohexanone and 2-chloro-cyclohexanone.

Special polymeric compounds with units corresponding to one of the general formula IIa and IIb are the polyaddition and condensation products containing recurrent units of the general formula III:

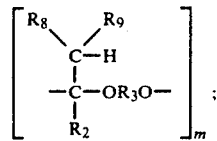

obtained by reaction of diols $HOR_3OH$ with enol ethers of the following formula:

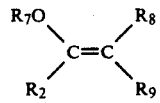

wherein
  m—is an integer from 2 to 80, preferably between 3 and 40,
  $R_2$—is H, an alkyl group, preferably with 1 to 12 carbon atoms, or an aryl group,
  $R_3$—is an alkylene group, preferably with 4 to 18 carbon atoms,
  $R_7$—is an alkyl group, preferably with 1 to 6 carbon atoms, more particularly a methyl or ethyl group, and
  $R_8$ and $R_9$—are H, or alkyl or aryl groups, preferably, they should not have more than 11 carbon atoms together.

Furthermore, $R_2$ and $R_8$, or $R_2$ and $R_9$, $R_3$ and $R_8$, $R_3$ and $R_9$ $R_8$ and $R_9$ may belong to a common ring which may be substituted. The aryl, alkyl and alkylene groups are those defined in connection with formula I. If different enol ethers and/or diols are used, different units of formula III are obtained in a statistical arrangement.

The enol ethers in which $R_2$ is H correspond to aldehydes containing at least one hydrogen atom attached to a saturated carbon atom in α-position to the carbonyl group, and the enol ethers in which $R_2$ is not H correspond to ketones containing at least one hydrogen atom attached to a saturated carbon atom in α-position to the carbonyl group. Because, as already stated, enol ethers may be used as starting materials instead of the corresponding carbonyl compounds, they are also referred to as their synthetic equivalents. Further synthetic equivalents are, for example, the alkynes, for example acetylene instead of acetaldehyde.

Suitable enol ethers are the enol ethers corresponding to the aldehydes and ketones listed above, with the above reservation. Their preparation is described, for example, in Houben-Weyl, Vol. VI/3, and in "Liebigs Annalen der Chemie," 601, 81 (1956).

Suitable diols are, for example, those mentioned in connection with formula IIa.

A further group of polymeric compounds containing recurrent acetal or ketal groups are the addition products obtained by adding diols to dienol ethers.

Preferably, the diols mentioned in connection with formula II are used.

Suitable dienol ethers are, e.g., the divinyl ethers obtained by adding diols to acetylene; such compounds are described, for example, in "Liebigs Annalen der Chemie," 601, 81 (1956). The following compounds are examples of preferred divinyl ethers:
  ethyleneglycol, butane-1,4-diol and hexane-1,6-diol-divinyl ether, and the divinyl ethers of polyalkylene glycols; diethyleneglycol divinyl ether is particularly preferred.

A further group of polymeric compounds containing units reaction products containing recurrent units corresponding to the general formula III may also be produced by the polyaddition of hydroxyalkyl-enol ethers. These starting substances contain the carbonyl equivalent and the alcoholic constituent in the same molecule. In this case, it is also possible for $R_3$ to be combined with $R_8$ or $R_9$ to form a possibly substituted ring.

If different hydroxy alkyl enol ethers are used, a polyaddition reaction produces statistical sequences of different units corresponding to formula III.

Suitable hydroxyalkyl enol ethers are described, e.g., in "Liebigs Annalen der Chemie" 601, 81 (1956); they are prepared by adding diols to alkynes, preferably acetylene. Suitable representatives of such compounds are, e.g.: diethyleneglycol monovinyl ether and triethyleneglycol monovinyl ether.

The above-described hydroxy alkyl vinyl ethers are also obtained, in the form of intermediate products that cannot be isolated, by the addition of 1 mole of 1,2- or 1,3-diol to alkylene dienol ethers, followed by intramolecular reacetalization during which the 1,3-dioxolanes or 1,3-dioxanes corresponding to the diols are split-off. Under the acidic conditions prevailing, polyaddition of the hydroxyalkyl-enol ethers to form polyacetals then occurs. At the same time, the resulting 1,3-dioxolane or 1,3-dioxane is isolated, together with a little diol.

A further group of polymeric compounds containing recurrent acetal or ketal groupings are reaction products containing units of the general formula IV. These compounds are produced by polycondensation of dialdehydes or diketones or their synthetic equivalents with 4-valent alcohols.

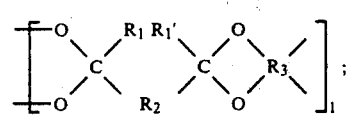

in this formula l is an integer from 1 to 40, preferably between 2 and 20, $R_1$ and $R_1'$ are H, aryl groups or alkyl groups, preferably with 1 to 12 carbon atoms which may be connected with each other to form a substituted or unsubstituted ring, $R_2$ is an alkylene group, preferably with 1 to 16 carbon atoms, or an arylene group, and $R_3$ is a 4-valent aliphatic group the free valences of which are attached to different carbon atoms at such distances that 5- or 6-membered rings are formed with the acetal group.

The aryl, alkyl and alkylene groups are those listed in connection with formula I.

Suitable dialdehydes or diketones, or dialdehydes or diketones from which the synthetic equivalents are derived are, for example: malonic dialdehyde, cyclohexa-1,4-dione or adipic dialdehyde.

Suitable 4-valent alcohols are, for example, 2,2,5,5-tetramethylol-cyclopentanone and 2,2,6,6-tetramethylol-cyclohexanone.

The above-described preferred polymers may be easily, quickly and very inexpensively obtained by polycondensation of easily accessible aldehydes and diols. The aldehydes may be replaced by the corresponding acetals or enol ethers, or by ketones or their ketals or the corresponding enol ethers.

This means that polyacetals or polyketals of practically any type can be prepared by polyaddition or polycondensation of aldehydes and ketones or their synthetic equivalents, with diols. Moreover, it is possible to vary the degree of polymerization within wide limits, for example, by further re-acetalization at elevated temperature, e.g., analogously to the processes disclosed in German Offenlegungsschrift No. 2,519,575.

Furthermore, it is possible to increase the molecular weight of the polyacetals or polyketals in known manner by reaction of the terminal OH groups with polyfunctional compounds capable of reaction with OH groups, e.g., with diisocyanates or diepoxides.

The molecular structure of the polyacetals and polyketals may be further modified by replacing a small portion of the diols employed by triols or tetraols. Thus, by causing a certain degree of branching of the polymeric molecules, the difference in solubility between the exposed and unexposed areas may be increased in a desirable manner. Of course, the solubility of the branched polymers must be sufficient to enable the preparation of coating solutions in suitable solvents. Suitable triols are, e.g., glycerol, 1,2,6-hexanetriol, trimethylol propane, 1,4,7-trihydroxy-heptane and the reaction products thereof with ethylene oxide.

The above-mentioned aldehydes and ketones and the aldehydes and ketones from which their synthetic equivalents are derived, and the multivalent alcohols should not contain substituents which may cause difficulties during polyaddition or polycondensation.

Besides a statistical structure, caused by copolyaddition and/or polycondensation of the above-mentioned aldehydes or ketones or their synthetic equivalents and diols, it is also possible for the polymeric compounds with recurrent acetal or ketal groupings to have a planned structure.

This may also be achieved in various ways. Besides "symmetrical" variants—obtained, for example, by the above-described polycondensation of dialdehydes or diketones, or their synthetic equivalents, with 4-valent alcohols—"asymmetrical" variants are also possible.

Thus, polymeric compounds with recurrent units corresponding to the general formula I may be prepared, for example, by the polyaddition of divinyl ethers—which may be obtained, e.g., by the addition of 1 mole of a diol to 2 moles of acetylene—with diols.

It is apparent that, by their structure, the polymeric compounds containing recurrent acetal or ketal groupings always can be derived from an aldehyde or ketone, or the multiples or equivalents thereof and a diol or a corresponding multiple of a diol.

The statement that the polymeric compounds containing recurrent acetal or ketal groupings result from a reaction of aldehydes and/or ketones, or their synthetic equivalents, with diols, under polyaddition and/or polycondensation, is to be understood in this broader sense.

The methods of preparation described in detail herein are particularly easily performed processes for the preparation of polymeric compounds having recurrent acetal or ketal groupings. A survey of further processes is contained, e.g., in Houben-Weyl, Vol. 14/2.

For the manufacture of the positive-working copying compositions according to the invention, the described polyacetals and/or polyketals are mixed with substances which are capable of forming acids under photochemical action and/or by the action of high energy radiation, especially electron beams.

Advantageously, the copying compositions further include a polymeric, preferably water-insoluble binder which is soluble in organic solvents. Because aqueous alkaline solutions may be used with advantage as liquid developers for the copying compositions according to the invention and because developers of this type generally are more advantageous than developers based on organic solvents, those binders are preferred which are soluble or at least swellable in aqueous alkaline solutions.

The phenol resins, especially the novolaks, found suitable for many positive copying compositions, also have proved very suitable and advantageous for the copying compositions according to the invention. These binders, especially the more highly condensed resins containing substituted phenols, e.g., cresols, as the formaldehyde-condensation partner, contribute to a pronounced differentiation between the exposed and unexposed areas of the layer during development. The novolaks may be modified in known manner, by a reaction of part of their hydroxy groups, e.g., with chloroacetic acid, isocyanates, epoxides or carboxylic acid anhydrides. Other alkali-soluble resins, such as copolymers of maleic acid anhydride and styrene, or of vinyl acetate and crotonic acid, or of methyl methacrylate and methacrylic acid, and the like, also may be used as binders. The type and quantity of the alkali-soluble resin may vary according to the purpose for which the composition is intended; proportions between 30 and 90 percent by weight, preferably between 55 and 85 percent by weight of the solids content are preferred. Additionally, numerous other resins may be incorporated, vinyl polymers, such as polyvinyl acetates, polyacrylates, polyvinyl ethers and polyvinyl pyrrolidones, which in turn may be modified by comonomers being preferred. The most favorable proportion of such resins depends on the practical requirements of each case and on the influence upon the developing conditions; normally, it does not exceed 20 percent by weight of the alkali-soluble resin. For special requirements with respect to flexibility, adhesion, gloss etc., other substances, such as polyglycols, cellulose derivatives, such as ethyl cellulose, wetting agents, dyestuffs and finely divided pigments, may be added to the light-sensitive composition in small quantities.

A vast number of known compounds and mixtures, such as diazonium salts, phosphonium salts, sulfonium salts and iodonium salts or halogen compounds, quinone diazide sulfochlorides and organometal/organohalogen combinations, may be used as radiation-sensitive constituents forming or splitting-off acids during irradiation.

Suitable diazonium salts are the compounds with a useful absorption range between 300 and 600 nm, which are known to be suitable for diazotype purposes. A number of suitable diazonium compounds known to possess a satisfactory shelf-life are mentioned in the examples, compounds containing no basic substituents being preferred.

As a rule, the above-mentioned diazonium, phosphonium, sulfonium and iodonium compounds are used in the form of salts soluble in organic solvents, normally as the separation products with complex acids, such as hydrofluoboric acid, hexafluophosphoric acid, hexafluoantimonic acid or hexafluoarsenic acid.

Alternatively, derivatives of positive-working o-quinone diazides may be used. In most cases, the acidity of the indene carboxylic acids produced by exposing the o-naphthoquinone diazides hardly suffices for a satisfactory imagewise differentiation. From this group of compounds, the naphthoquinone-1,2-diazide-4-sulfochloride is preferred, because, during its exposure, three acid functions are formed which give rise to a relatively high degree of intensification during splitting of the polyacetals and polyketals.

In principle, all organic halogen compounds known as free radical-forming photoinitiators, for example, those containing more than one halogen atom attached to a carbon atom or an aromatic ring, may be used as halogen-containing radiation-sensitive compounds capable of forming a hydrohalic acid. Examples of such compounds are disclosed in U.S. Pat. Nos. 3,515,552, 3,536,489, and 3,779,778, and in German Offenlegungsschrift No. 2,243,621. The effect of these halogen-containing compounds in the positive-working layers of the invention may be spectrally influenced and increased by the addition of known sensitizers.

Furthermore, certain substituted trichloro methylpyrones, such as those described in German Offenlegungsschrift No. 2,610,842, may be used. The new 2-aryl-4,6-bis-trichloromethyl-s-triazines disclosed in our simultaneously filed U.S. patent application Ser. No. 899,272, were found to be particularly advantageous.

Examples of suitable initiators are:
4-(di-n-propyl-amino)-benzene-diazonium-tetrafluoroborate,
4-p-tolylmercapto-2,5-diethoxy-benzene-diazonium-hexafluophosphate,
4-p-tolylmercapto-2,5-diethoxy-benzene-diazonium-tetrafluoborate,
diphenylamine-4-diazonium sulfate,
4-methyl-6-trichloromethyl-2-pyrone, 4-(3,4,5-trimethoxy-styryl)-6-trichloromethyl-2-pyrone,
4-(4-methoxy-styryl)-6-(3,3,3-trichloro-propenyl)-2-pyrone,
2-trichloromethyl-benzimidazole,
2-tribromomethyl-quinoline,
2,4-dimethyl-1-tribromoacetyl-benzene,
3-nitro-1-tribromo-acetyl-benzene,
4-dibromoacetyl-benzoic acid,
1,4-bis-dibromomethyl-benzene,
tris-dibromomethyl-s-triazine,
2-(6-methoxy-naphth-2-yl)-,
2-(naphth)-1-yl)-,
2-(naphth-2-yl)-,
2-(4-ethoxyethyl-naphth-1-yl)-,
2-(benzopyran-3-yl)-,
2-(4-methoxy-anthrac-1-yl)-, and
2-(phenanthr-9-yl)-4,6-bis-trichloromethyl-s-triazine
and the compounds mentioned in the Examples.

The quantity of the initiator may widely vary depending on its chemical nature and the composition of the layer. Favorable results are obtained with quantities ranging from about 0.1 to about 10 percent by weight, based on the total weight of the solids, quantities in the range from 0.2 to 5 percent by weight being preferred. Especially in the case of layers of more than 10 $\mu$m thickness, it is recommended to add only a relatively small quantity of the acid-donor to the layer.

Finally, soluble or finely distributed, dispersible dyestuffs may be added to the light-sensitive composition, and also UV-absorbing agents, if required for the intended use of the material. The most favorable proportions of the various components contained in the layer may be easily determined by preliminary tests.

Suitable solvents for the compositions according to the invention are ketones, such as methyl ethyl ketone, chlorinated hydrocarbons, such as trichloro-ethylene and 1,1,1-trichloro-ethane, alcohols, such as n-propanol, ethers, such as tetrahydrofuran, alcohol ethers, such as ethylene glycol monomethyl ether, and esters, such as butyl acetate. Mixtures of these solvents may also be used, and other solvents, such as acetonitrile, dioxane, or dimethyl formamide may be added for special purposes. In principle, all solvents are suitable which do not undergo an irreversible reaction with the components of the layer.

When selecting the solvent, however, the intended coating method, the thickness of the layer, and the drying apparatus to be used should be considered. Thin layers of up to 5 $\mu$m prepared in small quantities for testing purposes, are preferably applied by whirler-coating. In this manner, layers of a thickness of more than 60 $\mu$m may be produced by a single application or by means of a doctor knife from solutions having a solids content of up to 40 percent. If both surfaces are to be coated, a dip coating process is preferred, advantageously using a low boiling point solvent so that the coating dries quickly. Webs are coated by roller application, by means of slot dies or by spraying; sheet materials, such as zinc or multi-metal plates, may be coated with the aid of a curtain coater.

As compared with other known positive-working layers, especially those containing o-naphthoquinone diazides, greater advantages are achieved in the production of relatively thick layers, because the light-sensitivity of the light-sensitive compositions according to the invention is less dependent on the thickness of the layers. Exposure and processing of layers having a thickness of up to 100 $\mu$m and more is possible.

In the case of relatively thick layers of more than 10 $\mu$m thickness, the preferred supporting materials are plastic films which serve as temporary supports for transfer layers. For this purpose, and for color proofing films, polyester films, e.g., polyethylene terephthalate films, are preferred. Polyolefin films, e.g., polypropylene films, also may be used, however. In the case of layers below a thickness of about 10 μm, metals are normally used as supports. For the preparation of offset printing plates, mechanically or electrochemically roughened and possibly anodized aluminum plates may be used, which additionally may be pretreated by a chemical process, for example, with polyvinyl phosphonic acid, silicates or phosphates. Multi-metal plates containing copper and chromium or brass and chromium as the uppermost layers are also suitable. For use as relief printing plates, the layers according to the present invention may be applied to zinc or magnesium plates, to commercially available micro-crystalline alloys thereof suitable for powderless etching, or to etchable plastic materials, such as polyoxymethylene. Due to their good adhesion and etching resistance on copper or nickel surfaces, the layers according to the invention are suitable for use as intaglio and screen printing forms. The copying compositions according to the invention also may be used as photoresists for chemical milling.

Finally, the coatings may be applied either directly or by transferring them from temporary supports to circuit board materials composed of insulating plates with a copper layer on one or both surfaces thereof, or to glass or ceramic materials which may be pretreated with an adhesion promoter, or to slices of silicon which, in microelectronics, are suitable for imaging by electron beams. Moreover, it is possible to coat wood, textiles, and the surfaces of many materials, which advantageously are imaged by projection, provided the materials are resistant to the attack of alkaline developers.

Conventional apparatuses and conditions may be used for drying the coated layers, temperatures of about 100° C. and even brief heating to 120° C. being withstood by the layers without detracting from their radiation-sensitivity.

The light sources normally used for copying, viz. tubular lamps, pulsed xenon sources, metal-halide-doped high pressure mercury vapor lamps, and carbon arc lamps, also may be used for exposing the material according to the present invention. In addition thereto, the light-sensitive polyacetal and/or polyketal layers may be exposed in conventional projection and enlargement apparatuses to the light of metallic-filament lamps or by contact exposure under ordinary incandescent bulbs. Further, coherent laser beams may be used for exposure. For the purposes of the present invention, short-wave lasers of adequate energy, for example argon lasers, krypton-ion lasers, dyestuff lasers, and helium-cadmium lasers emitting between 300 and 600 nm were found to be suitable. The laser beam is directed by a given, programmed line and/or screen movement.

As a further possibility, the material according to the invention may be irradiated with electron beams. The copying compositions according to the invention, the same as numerous other organic materials, may be thoroughly decomposed and cross-linked by electron beams, so that a negative image is formed after the unexposed areas have been removed by a solvent or by exposure without an original and development. In the case of an electron beam of lower intensity and/or higher operating speed, however, the electron beam causes differentiation toward a higher solubility, i.e. the irradiated areas of the layer may be removed by a developer. It was found that the layers according to the present invention are considerably more sensitive to electron beams than are ordinary naphthoquinone diazide layers, and that a wide range of electron beams of relatively low energy efficiency may be used, as illustrated in the Examples. The most favorable conditions may be easily ascertained by preliminary tests.

After imagewise exposure or irradiation, the layers according to the invention may be removed virtually by the same developers as are used for commercial naphthoquinone diazide layers and resist layers, or the copying conditions of the new layers may be advantageously adapted to known auxiliaries, such as developer solutions and programmed spray developing devices. The aqueous developer solutions used may contain, for example, alkali phosphates, alkali silicates, or alkali hydroxides, and also wetting agents, and minor proportions of organic solvents. In certain cases, mixtures of solvents and water may be used for development. The most suitable developer may be determined by running tests with the layer in question. If necessary, the developing process may be assisted by mechanical means.

In order to increase their mechanical strength during the printing process and their resistance to wash-out solutions, correcting agents and UV-hardenable printing inks, the developed plates may be briefly heated to relatively high temperatures, as is known for diazo layers and described, for example, in British Pat. No. 1,154,749.

The present invention also relates to a process for the production of relief images wherein a radiation-sensitive recording material comprising, as the essential components, (a) a compound which yields an acid under the influence of actinic radiation, and (b) an organic polymeric compound which contains recurrent acetal or ketal groupings in its main chain, and whose solubility in a developer liquid is increased by the action of an acid, is imagewise exposed to actinic radiation to such an extent that the solubility of the layer in a liquid developer is increased, and the irradiated portions of the layer are then removed by means of a developer. In the process a compound (b) is used in which each α-carbon atom of the alcoholic constituent of the acetal or ketal grouping is aliphatic.

If electron beams are used for performing the process of the invention it is also possible to use, as well as the known photolytic acid-donors sensitive to light within the visible and near UV range of the spectrum, acid donors which have their absorption ranges within the relatively short wave range of the electromagnetic spectrum and thus are less sensitive to daylight. This has the advantage that the recording material according to the invention need not be handled in the absence of light and that a better storability of the materials may be achieved.

Examples of such initiators are, e.g.: tribromomethyl-phenylsulfone, 2,2',4,4',6,6'-hexabromo-diphenylamine, pentabromoethane, 2,3,4,5-tetra-chloroaniline, pentaerythritol-tetra-bromide, clopheneresin W, i.e., a chlorinated terphenyl resin, or chlorinated paraffins.

In the following, examples of copying compositions according to the invention are described. First the preparation of a series of new polyacetals and polyketals will be described, which were found to be suitable for use in the copying composition according to the invention as compounds capable of being split-up by acids. They are numbered Compounds 1 to 106 and will be referred to by these numbers in the Examples.

In the Examples, the relation between parts by weight and parts by volume corresponds to that between grams and milliliters. Percentages and proportions are by weight unless otherwise stated.

General Instruction A—for the preparation of Compounds Nos. 1 to 46 listed in Table 1.

In a solvent which is inert under the reaction conditions and forms an azeotrope with water, e.g., benzene, toluene, xylene, chloroform or methylene chloride, aldehyde and diol in a molar ratio of about 1:1 are heated to the boiling point, with reflux, in the presence of 1 to 2 percent by weight of an acid catalyst, e.g., an acid ion exchanger, until no further reaction water is separated. After neutralization, for example with sodium carbonate, the reaction mixture is filtered and freed from solvent. The highly viscous oil remaining after removal of the volatile constituents under high vacuum at 100° to 150° C. shows virtually no hydroxyl or carbonyl bands in the IR spectrum. In the NMR spectrum, the characteristic signals for acetal protons stated in Table 1 are found.

The above-listed compounds are also obtained if the reaction water is directly distilled off. In this case, it is possible to work without a solvent (see General Instruction B) or to use a high-boiling point inert solvent, e.g., o-dichlorobenzene. Alternatively, it is possible to remove the reaction water under reduced pressure (see General Instruction C), if no solvent and a low reaction temperature are used.

TABLE 1

Compounds corresponding to General Formula IIa

| Compound No. | $R_1$ | $R_3$ | NMR acetal protons δ(ppm) ($CDCl_3$) | Yield (% of theoretical) |
|---|---|---|---|---|
| 1 | Isopropyl | $-(CH_2)_2-O-(CH_2)_2-$ | 4.15 | 52 |
| 2 | n-Hexyl | $-(CH_2)_2-(OCH_2CH_2)_2-$ | 4.56 | 78 |
| 3 | n-Hexyl | $-(CH_2)_2-(OCH_2CH_2)_3-$ | 4.54 | 73 |
| 4 | Isopropyl | $-(CH_2)_2-(OCH_2CH_2)_2-$ | 4.18 | 74 |
| 5 | Isopropyl | $-(CH_2)_2-(OCH_2CH_2)_3-$ | 4.17 | 66 |
| 6 | Isopropyl | p-Xylylene | 4.35 | 46 |
| 7 | n-Propyl | $-(CH_2)_2-(OCH_2CH_2)_2-$ | 4.60 | 52 |
| 8 | 1-Ethyl-propyl | $-(CH_2)_2-(OCH_2CH_2)_2-$ | 4.41 | 45 |
| 9 | 1-Ethyl-pentyl | $-(CH_2)_2-(OCH_2CH_2)_2-$ | 4.48 | 66 |
| 10 | Phenyl | $-(CH_2)_2-(OCH_2CH_2)_2-$ | 5.62 | 47 |
| 11 | Cyclohexyl | $-(CH_2)_2-(OCH_2CH_2)_2-$ | 4.22 | 60 |
| 12 | Ethyl | $-(CH_2)_2-(OCH_2CH_2)_2-$ | 4.50 | 71 |
| 13 | n-Butyl | $-(CH_2)_2-(OCH_2CH_2)_2-$ | 4.57 | 80 |
| 14 | Isopropyl | $-(CH_2)_5-$ | 4.07 | 87 |
| 15 | 3-Cyclohexene-1-yl | $-(CH_2)_2-(OCH_2CH_2)_2-$ | 4.35 | 74 |
| 16 | 1-Ethyl-propyl | p-Xylylene | 4.55 | 47 |
| 17 | Isopropyl | $-(CH_2)_2-S-(CH_2)_2-$ | 4.15 | 67 |
| 18 | Phenyl | p-Xylylene | 5.71 | 78 |
| 19 | Phenyl | $-(CH_2)_5-$ | 5.45 | 66 |
| 20 | Ethyl | 1,4-Cyclohexylene | 4.48 | 73 |
| 21 | Ethyl | 1-Ethyl-heptylene | 4.37 | 88 |
| 22 | n-Undecyl | $-(CH_2)_2-(OCH_2CH_2)_2-$ | 4.57 | 89 |
| 23 | Ethyl | 1,4-Dimethyl-cyclohexan-7,8-ylene | 4.34 | 92 |
| 24 | Ethyl | $-(CH_2)_2-O-CH_2-C\equiv C-CH_2-O-(CH_2)_2-$ | 4.56 | 61 |
| 25 | 2,4-Dichlorophenyl | $-(CH_2)_2-(OCH_2CH_2)_2-$ | 6.11 | 70 |
| 26 | Ethyl | 4,8-Dimethyl-tricyclo-[4,3,1,0]-decan-11,12-ylene | 4.37 | 91 |
| 27 | n-Pentyl | $-(CH_2)_2-(OCH_2CH_2)_2-$ | 4.60 | 70 |
| 28 | n-Nonyl | $-(CH_2)_2-(OCH_2CH_2)_2-$ | 4.57 | 71 |
| 29 | Ethyl | $-(CH_2)_3-(OCH_2CH_2)_2-$ | 4.50 | 43 |
| 30 | Ethyl | p-Xylylene | 4.65 | 60 |
| 31 | 2-Phenyl-ethyl | p-Xylylene | 4.70 | 49 |
| 32 | 2-Phenyl-ethyl | $-(CH_2)_2-(OCH_2CH_2)_2-$ | 4.60 | 82 |
| 33 | Ethyl | $-(CH_2)_2-(OCH_2CH_2)_4-$ | 4.51 | 51 |
| 34 | Ethyl | $-(CH_2)_2-(OCH_2CH_2)_6-$ | 4.50 | 67 |
| 35 | Ethyl | $-(CH_2)_2-(OCH_2CH_2)_3-$ | 4.51 | 55 |
| 36 | Tricyclo-[4,3,1,0]-decyl | $-(CH_2)_2-(OCH_2CH_2)_2-$ | 4.33 | 87 |
| 37 | $(CH_3)_2CH-CH_2-O-CH_2-C(CH_3)_2-$ | $-(CH_2)_2-(OCH_2CH_2)-$ | 4.35 | 64 |
| 38 | 4-Chlorophenyl | $-(CH_2)_2-(OCH_2CH_2)_2-$ | 5.74 | 66 |
| 39 | 3-Chlorophenyl | $-(CH_2)_5-$ | 5.48 | 83 |
| 40 | 3-Chlorophenyl | $-(CH_2)_2-(OCH_2CH_2)_2-$ | 5.61 | 81 |
| 41 | 4-Isopropylphenyl | $-(CH_2)_5-$ | 5.45 | 63 |
| 42 | 1-Propenyl | $-(CH_2)_5-$ | 4.65 | 41 |
| 43 | Ethyl | $-(CH_2)_5-$ | 4.48 | 75 |
| 44 | Tricyclo-[4,3,1,0]-decyl | $-(CH_2)_5-$ | 4.21 | 43 |
| 45 | Ethyl | $-(CH_2)_6-$ | 4.39 | 46 |
| 46 | Isopropyl | $-(CH_2)_2-(OCH_2CH_2)_8$ | 4.35 | 79 |

General Instruction B—for the preparation of Compounds Nos. 47 to 63 listed in Table 2

Acetal or ketal and diol, in a molar ratio of about 1:1, are heated in the presence of 1 to 2 percent by weight of an acid catalyst, e.g., mesitylene sulfonic acid, until the low boiling point alcohol formed during the reaction is completely distilled off. After adding an inert solvent and sodium carbonate in solid form, the reaction mixture is filtered and freed from solvent. The highly viscous oil remaining after the removal of the volatile constituents under high vacuum at 100° to 150° C. shows no hydroxyl bands in the IR spectrum.

The compounds also may be obtained by removing the low boiling point alcohol at low temperature under reduced pressure (see General Instruction C) or at a relatively high temperature in the presence of a high boiling point inert solvent, such as o-dichlorobenzene.

General Instruction C—for the preparation of Compounds Nos. 64 to 83 listed in Table 3

Vinyl ether and diol, in a molar ratio of about 1:1, are stirred for 2 to 3 hours at room temperature or slightly elevated temperature in the presence of 1 to 2 percent by weight of an acid catalyst, for example, potassium hydrogensulfate. The low boiling point alcohol liberated during the reaction is completely removed by means of a water jet vacuum. After adding an inert solvent and solid sodium carbonate, the reaction mixture is filtered and freed from solvent. The highly viscous oil remaining after removal of low boiling point constituents at 100° to 150° C. in a high vacuum shows virtually no hydroxyl bands and no bands within the double bond region in the IR spectrum. In the NMR spectrum, the vinylic proton has disappeared.

The above-mentioned compounds are also obtained if the low boiling point alcohol is directly distilled off, without the use of a solvent (see General Instruction B) or in the presence of high boiling point inert solvents, such as o-dichlorobenzene.

TABLE 2
Compounds corresponding to General Formulae IIa or IIb

| Compound No. | $R_1$ | $R_2$ | $R_3$ | Yield (% of theoretical) |
|---|---|---|---|---|
| 47 | Phenyl | H— | —$(CH_2)_5$— | 80 |
| 48 | Trichloromethyl | H— | —$(CH_2)_2$—$(OCH_2CH_2)_2$— | 40 |
| 49 | 1-Ethyl-pentyl | H— | —$(CH_2)_5$— | 55 |
| 50 | 4-Methoxy-phenyl | H— | —$(CH_2)_5$— | 68 |
| 51 | Phenyl | Methyl | —$(CH_2)_2$—$(OCH_2CH_2)_2$— | 78 |
| 52 | Phenyl | Phenyl | —$(CH_2)_5$— | 80 |
| 53 | —$(CH_2)_5$— | | —$(CH_2)_2$—$(OCH_2CH_2)_2$— | 78 |
| 54 | Methyl | p-Tolyl | —$(CH_2)_2$—$(OCH_2CH_2)_2$— | 75 |
| 55 | Methyl | Ethyl | —$(CH_2)_2$—$(OCH_2CH_2)_2$— | 79 |
| 56 | n-Nonyl | n-Nonyl | —$(CH_2)_5$— | 75 |
| 57 | Methyl | α-Naphthyl | —$(CH_2)_5$— | 92 |
| 58 | Phenyl | Ethyl | 1,4-Dimethyl-cyclo-hexan-7,8-ylene | 75 |
| 59 | Ethyl | Ethyl | —$(CH_2)_2$—$(OCH_2CH_2)_3$— | 81 |
| 60 | Methyl | n-Pentyl | —$(CH_2)_5$— | 61 |
| 61 | Isopropyl | Methyl | —$(CH_2)_6$— | 60 |
| 62 | Phenyl | n-Dodecyl | —$(CH_2)_2$—$(OCH_2CH_2)_3$— | 92 |
| 63 | n-Nonyl | Methyl | p-Xylylene | 76 |

TABLE 3
Compounds corresponding to General Formula III

| Compound No. | $R_2$ | $R_8$ | $R_9$ | $R_3$ | Yield (% of theoretical) |
|---|---|---|---|---|---|
| 64 | n-Propyl | Ethyl | H— | —$(CH_2)_2$—$(OCH_2CH_2)_2$— | 70 |
| 65 | n-Propyl | Ethyl | H— | p-Xylylene | 76 |
| 66 | n-Propyl | Ethyl | H— | —$(CH_2)_2$—O—$(CH_2)_2$— | 88 |
| 67 | n-Propyl | Ethyl | H— | —$(CH_2)_5$— | 91 |
| 68 | n-Propyl | Ethyl | H— | 1,4-Dimethyl-cyclo-hexan-7,8-ylene | 84 |
| 69 | n-Propyl | Ethyl | H— | 4,8-Dimethyl-tri-cyclo-[4,3,1,0]-decan-11,12-ylene | 96 |
| 70 | Methyl | Phenyl | H— | —$(CH_2)_2$—$(OCH_2CH_2)_2$— | 85 |
| 71 | H— | Methyl | Phenyl | —$(CH_2)_2$—$(OCH_2CH_2)_2$— | 80 |
| 72 | —$(CH_2)_4$— | | H— | —$(CH_2)_2$—$(OCH_2CH_2)_2$— | 61 |
| 73 | —$(CH_2)_4$— | | H— | p-Xylylene | 78 |
| 74 | —$(CH_2)_4$— | | H— | 1,4-Dimethyl-cyclo-hexan-7,8-ylene | 87 |
| 75 | —$(CH_2)_4$— | | H— | 4,8-Dimethyl-tri-cyclo-[4,3,1,0]-decan-11,12-ylene | 98 |
| 76 | —$(CH_2)_4$— | | H— | —$(CH_2)_5$— | 78 |
| 77 | —$(CH_2)_4$— | | H— | —$(CH_2)_2$—O—$(CH_2)_2$— | 62 |
| 78 | —$(CH_2)_4$— | | Methyl | —$(CH_2)_2$—$(OCH_2CH_2)_2$— | 75 |

TABLE 3-continued

Compounds corresponding to General Formula III

| Compound No. | $R_2$ | $R_8$ | $R_9$ | $R_3$ | Yield (% of theoretical) |
|---|---|---|---|---|---|
| 79 | —$(CH_2)_3CH(CH_3)$— | | Methyl | p-Xylylene | 63 |
| 80 | —$(CH_2)_2CH(CH_3)CH_2$— | | H— | —$(CH_2)_2$—$(OCH_2CH_2)_2$— | 63 |
| 81 | —$(CH_2)_3$—$CH(CH_3)$— | | H— | 1,4-Dimethyl-cyclo-hexan-7,8-ylene | 94 |
| 82 | 2-tert.-Butyl-butylene | | H— | 4,8-Dimethyl-tri-cyclo-[4,3,1,0]-decan-11,12-ylene | 72 |
| 83 | —$(CH_2)_4$— | | Phenyl | —$(CH_2)_2$—$(OCH_2CH_2)_2$ | 84 |

Compounds Nos. 84 to 93

For the preparation of Compounds Nos. 84 to 93 listed in Table 4, one of the General Instructions A to C applies. The compounds are condensates. The acetal or ketal groupings produced from carbonyl constituents or their equivalents and diol constituents are present in a statistical arrangement.

The following compounds were reacted with each other:

Compound No. 84: benzaldehyde and 2-ethyl-butyraldehyde with pentane-1,5-diol
Compound No. 85: isobutyraldehyde with pentane-1,5-diol and diethyleneglycol
Compound No. 86: 2-ethyl-butyraldehyde and benzaldehyde with triethyleneglycol and pentane-1,5-diol
Compound No. 87: benzaldehyde and 2-ethyl-butyraldehyde with triethyleneglycol
Compound No. 88: benzaldehyde-diethylacetal and 2-ethyl-hexanal-diethylacetal with pentane-1,5-diol
Compound No. 89: cyclohexanone-diethylketal and anisaldehyde-diethylacetal with triethyleneglycol
Compound No. 90: 2-methoxy-cyclohexene with triethyleneglycol and pentane-1,5-diol
Compound No. 91: 2-methoxy-cyclohexene and 4-methoxy-hept-3-ene with p-xylyleneglycol
Compound No. 92: benzaldehyde-diethylacetal and 2-methoxy-cyclohexene with triethyleneglycol
Compound No. 93: enanthic aldehyde and benzaldehyde-diethylacetal with triethyleneglycol

TABLE 4

Compounds corresponding to General Formula I

| Compound No. | $R_1$ | $R_2$ | $R_3$ | $R_4$ | $R_5$ | $R_6$ | Yield (% of theoretical) |
|---|---|---|---|---|---|---|---|
| 84 | Phenyl | H— | —$(CH_2)_5$—O— | 1-Ethyl-propyl | H— | —$(CH_2)_5$—O— | 68 |
| 85 | H— | Isopropyl | —$(CH_2)_5$—O— | H— | Isopropyl | —$(CH_2CH_2O)_2$— | 70 |
| 86 | H— | 1-Ethyl-propyl | —$(CH_2)_5$—O— | Phenyl | H— | —$(CH_2CH_2O)_3$— | 53 |
| 87 | Phenyl | H— | —$(CH_2CH_2O)_3$— | H— | 1-Ethyl-propyl | —$(CH_2CH_2O)_3$— | 48 |
| 88 | Phenyl | H— | —$(CH_2)_5$—O— | 1-Ethyl-pentyl | H— | —$(CH_2)_5$—O— | 73 |
| 89 | | —$(CH_2)_5$— | —$(CH_2CH_2O)_3$— | p-Methoxy-phenyl | H— | —$(CH_2CH_2O)_3$— | 81 |
| 90 | | —$(CH_2)_5$— | —$(CH_2CH_2O)_3$— | —$(CH_2)_5$— | | —$(CH_2)_5$—O— | 84 |
| 91 | | —$(CH_2)_5$— | p-Xylyleneoxy | n-Propyl | n-Propyl | p-Xylyleneoxy | 51 |
| 92 | | —$(CH_2)_5$— | —$(CH_2CH_2O)_3$— | H— | Phenyl | —$(CH_2CH_2O)_3$— | 80 |
| 93 | H— | Phenyl | —$(CH_2CH_2O)_3$— | n-Hexyl | H— | —$(CH_2CH_2O)_3$— | 48 |

General Instruction D—for the preparation of Compounds Nos. 94 to 102 listed in Table 5.

With cooling, an equivalent molar quantity of a divinyl ether is cautiously added, drop by drop, and in the presence of 1 to 2 percent by weight of an acid catalyst, e.g., sulfuric acid or p-toluenesulfonic acid, to a solution of the diol in an inert solvent, such as methylene chloride. After three hours' stirring at room temperature, the reaction mixture is neutralized by adding solid sodium carbonate and is then filtered and freed from solvent. The highly viscous oil remaining after removal of the volatile constituents in a high vacuum at 100° to 150° C. shows practically no hydroxyl bands and no bands in the double bond region in the IR spectrum. An NMR spectrum does not show any vinylic proton. The acetal proton signals characteristic for polyacetals are stated in Table 5.

TABLE 5

Compounds corresponding to Formula I

| Compound No. | $R_1 = R_4$ | $R_2 = R_5$ | $R_3$ | $R_6$ | NMR acetal protons | Yield (% of theoretical) |
|---|---|---|---|---|---|---|
| 94 | $CH_3$— | H— | —$(CH_2)_2$—O—$(CH_2)_2$— | —$(CH_2)_2$—O—$(CH_2)_2$— | 4.79 | 60 |
| 95 | $CH_3$— | H— | —$(CH_2)_2$—O—$(CH_2)_2$— | —$(CH_2)_4$— | 4.78 | 49 |
| 96 | $CH_3$— | H— | —$(CH_2)_2$—O—$(CH_2)_2$— | —$(CH_2)_5$— | 4.74 | 61 |
| 97 | $CH_3$— | H— | —$(CH_2)_2$—O—$(CH_2)_2$— | —$(CH_2)_2(OCH_2CH_2)_2$— | 4.79 | 71 |
| 98 | $CH_3$— | H— | p-Xylylene | —$(CH_2)_2$—O—$(CH_2)_2$— | 4.86 | 68 |
| 99 | $CH_3$— | H— | 1,4-Cyclohexylene | —$(CH_2)_2$—O—$(CH_2)_2$— | 4.85 | 80 |
| 100 | $CH_3$— | H— | —$(CH_2)_2$—O—$(CH_2)_2$— | 1,4-Dimethyl-cyclohexan-7,8-ylene | 4.73 | 62 |
| 101 | $CH_3$— | H— | —$(CH_2)_2$—O—$(CH_2)_2$— | 4,8-Dimethyl-tricyclo- | 4.70 | 99 |

TABLE 5-continued

Compounds corresponding to Formula I

| Compound No. | $R_1 = R_4$ | $R_2 = R_5$ | $R_3$ | $R_6$ | NMR acetal protons | Yield (% of theoretical) |
|---|---|---|---|---|---|---|
| 102 | $CH_3$— | H— | —$(CH_2)_4$— | 4,3,1,0-decan-11,12-ylene —$(CH_2)_2$—$(OCH_2)_2$— | 4.75 | 62 |

Compound No. 103

While cooling with ice, 15.8 grams of diethyleneglycol divinyl ether are cautiously added, drop by drop, to a solution of 7.6 g of propane-1,3-diol in 10 ml of methylenechloride to which 2 drops of concentrated sulfuric acid have been added. After stirring the mixture for two hours at room temperature, a further 40 ml of methylenechloride and 1 g of solid sodium carbonate are added. After filtration and concentration of the organic phase, a crude product results which contains acetaldehyde-trimethylene acetal among its volatile constituents. After removal of the low boiling point constituents in a high vacuum at 150° C., 80 g of a viscous oil remain. The signals obtained in an NMR spectrum [$^1$HNMR ($CDCl_3$, TMS): $\delta = 4.82$ ppm (quartet, 1 acetal proton) $\delta = 3.68$ ppm (singlet, 12 methylene protons), and $\delta = 1.34$ ppm (doublet, 3 methyl protons)] correspond to the recurrent unit of the diethyleneglycol monovinyl ether polymer.

The same reaction product is obtained, for example, by reaction of diethyleneglycol divinyl ether with ethyleneglycol, 2,2-diethylpropane-1,3-diol and 2-ethyl-2-butyl-propane-1,3-diol.

Compounds Nos. 104 to 106

For the preparation of Compounds Nos. 104 to 106 General Instructions B or C are applied to the following bis-acetals or bis-ketals and tetra-(hydroxyalkyl) compounds:

Compound No. 104: 2,2,5,5-tetramethylol-cyclopentanone and cyclohexane-1,4-dione-tetramethylketal Compound No. 105: malonic dialdehyde-tetramethylacetal and 2,2,5,5-tetramethylol-cyclopentanone Compound No. 106: adipic dialdehyde-tetraethylacetal and 2,2,5,5-tetramethylol-cyclopentanone.

In all cases polymers are obtained which show a carbonyl band originating from the cyclopentanone constituent. There are no further carbonyl or hydroxyl bands.

EXAMPLE 1

This example shows the suitability of very different polyacetal acid donor combinations as components of positive-working copying compositions:

Brushed aluminum plates are whirler coated with a solution comprising

- 4.7—p.b.w. of a cresol-formaldehyde novolak (melting point 105°–120° C., by the capillary method according to DIN 53181),
- 1.4—p.b.w. of a polymeric acetal,
- 0.23—p.b.w. of the acid donor,
- 0.02—p.b.w. of Crystal Violet, and
- 93.65—p.b.w. of methyl ethyl ketone, layers of 1.2 μm thickness being obtained. The plates are imagewise exposed for 7.5 seconds from a distance of 110 cm under a 5 kW metal halide lamp and then developed with one of the following developer solutions A or B:

Developer Solution A

- 5.5% of sodium metasilicate.$9H_2O$
- 3.4% of trisodium phosphate.$12H_2O$
- 0.4% of anhydrous sodium dihydrogen phosphate
- 90.7% of thoroughly desalted water.

Developer Solution B

- 0.6% of NaOH
- 0.5% of $Na_2SiO_3.5H_2O$
- 1.0% of n-butanol
- 97.9% of completely desalted water.

The following Table 6 shows the combinations of acid donors, the developers used, and the developing times.

TABLE 6

| No. | Compound | Acid Donor | Developer | Developing Time (seconds) |
|---|---|---|---|---|
| 1 | 5 | 2,5-diethoxy-4-(p-tolyl-mercapto)-benzene diazonium hexafluophosphate | A | 20 |
| 2 | 5 | as in 1, but in the form of the tetrafluoborate | A | 45 |
| 3 | 6 | naphthoquinone-(1,2)-diazide-(2)-4-sulfonic acid chloride | B | 10 |
| 4 | 10 | 2-(4-ethoxy-naphth-1-yl)-4,6-bis-trichloromethyl-s-triazine | A | 20 |
| 5 | 13 | 2,5-diethoxy-4-(4-ethoxy-phenyl)-benzene diazonium hexafluophosphate | A | 20 |
| 6 | 23 | 2-(3-methoxynaphth-2-yl)-4,6-bis-trichloromethyl-s-triazine | B | 75 |
| 7 | 96 | 4-(2,4-dimethoxy-styryl)-6-trichloromethyl-pyr-2-one | A | 30 |
| 8 | 99 | after-chlorinated 4-(4-methoxystyryl)-6-trichloromethyl-pyr-2-one | A | 10 |
| 9 | 100 | after-chlorinated 4-(3,4-methylenedioxy-styryl)-6-trichloromethyl-pyr-2-one | A | 50 |
| 10 | 43 | 2-(4,7-dimethoxy-naphth-1-yl)-4,6-bis-trichloromethyl-s-triazine | A | 20 |

In all cases, a positive image of the original is obtained, the highest practical light-sensitivities being found in Test Nos. 4 and 10.

EXAMPLE 2

A composite plate comprising an insulating material (phenol resin laminate) and a 35 μm thick copper foil which may be used for the manufacture of circuit boards is provided with a resist layer of the following composition:

- 39—p.b.w. of the novolak used in Example 1 are dissolved in
- 71—p.b.w. of a solvent mixture of 82 p.b.w. of ethylene glycol monoethylether, 9 p.b.w. of butyl acetate, and 9 p.b.w. of xylene.
- 84.2—p.b.w. of this solution are used to dissolve
- 12.1—p.b.w. of Compound No. 43,
- 0.5—p.b.w. of 2-(4-methoxystyryl)-4,6-bis-trichloromethyl-s-triazine,
- 0.8—p.b.w. of the dyestuff "C. I. Solvent Blue 16," and
- 2.4—p.b.w. of a modified silicon glycol (commercially available coating auxiliary), and
- 58.5—p.b.w. of this solution are again dissolved with
- 41.5—p.b.w. of the above solvent mixture.

The composite plate is immersed in this solution and withdrawn at a speed of 40 cm/min. After the coating has been dried for 10 minutes at 100° C., a 5 μm thick layer results. The coated plate is imagewise exposed for 70 seconds through a line original, using the metal halide lamp used in Example 1 as the light source, and is then developed by spraying with Developer B used in Example 1. By etching with an iron trichloride solution, the bared copper layer is removed without attacking the unexposed areas of the layer which are covered by the resist layer.

The example is repeated, but in this case a lead/tin layer is electrodeposited after development on the bared copper layer in a suitable bath. The resist layer is also resistant to this process.

EXAMPLE 3

For the preparation of a positive-working photoresist of high layer thickness,
- 29.64—p.b.w. of the novolak used in Example 1,
- 8.89—p.b.w. of Compound No. 94,
- 0.12—p.b.w. of 2-(4-methoxynaphth-1-yl)-4,6-bis-trichloromethyl-s-triazine, and
- 2.08—p.b.w. of the coating auxiliary used in Example 2 are dissolved in
- 59.27—p.b.w. of butan-2-one.

With the aid of a wire bar No. 40, a nickel plate provided with a conventional electroconductive release layer is coated with this solution. The coating is dried for 20 minutes at a temperature of 100° C. The dried layer is imagewise exposed for 120 seconds from a distance of 110 cm to the light of a 5 kW metal halide lamp. By shaking the plate in the Developer A used in Example 1, the exposed portions of the layer are dissolved within 2.5 minutes. An electrotype stencil of about 60 μm thickness is thus produced which is used to form the webs of a nickel screen in a commercial nickel sulfamate bath. After completion of the electrodeposition process, the meshes are opened, i.e. the stencil is removed by dissolving the resist with acetone. If a cylinder is treated in this manner, printing forms for rotary screen printing result.

EXAMPLE 4

Brushed aluminum plates are coated by immersing them in solutions of

- 10.64—p.b.w. of the novolak used in Example 1,
- 3.20—p.b.w. of polyacetal or polyketal,
- 0.16—p.b.w. of 2-(4-(2-ethoxy-ethoxy)-naphth-1-yl)-4,6-bis-trichloromethyl-s-triazine, in
- 86.00—p.b.w. of methyl ethyl ketone.

After removal from the bath and evaporation of the solvent, the plates are dried for 20 seconds in a current of warm air and then exposed under a line original covered by a 1 mm thick glass plate. The exposure apparatus comprises four fluorescent lamps of type TLAK 40 W/05, manufactured by Messrs. Philips, which are arranged at a distance of 4 cm from each other. The distance between the periphery of the tubular lamps and the surface of the plates was about 5 cm. The exposure times used for the various polyacetals and polyketals are listed in the following table:

| Compound | Exposure Time (seconds) | Compound | Exposure Time (seconds) |
|---|---|---|---|
| 11 | 15 | 54 | 7 |
| 15 | 22 | 55 | 3 |
| 16 | 19 | 56 | 19 |
| 17 | 5 | 57 | 10 |
| 21 | 10 | 58 | 46 |
| 24 | 5 | 59 | 7 |
| 25 | 105 | 60 | 5 |
| 27 | 10 | 61 | 3 |
| 28 | 13 | 62 | 5 |
| 29 | 9 | 63 | 5 |
| 30 | 7 | 64 | 4 |
| 31 | 11 | 65 | 5 |
| 32 | 17 | 66 | 3 |
| 33 | 14 | 67 | 4 |
| 34 | 25 | 68 | 3 |
| 35 | 40 | 69 | 7 |
| 37 | 21 | 70 | 4 |
| 40 | 18 | 71 | 75 |
| 41 | 4 | 72 | 4 |
| 42 | 13 | 73 | 9 |
| 44 | 10 | 74 | 12 |
| 45 | 40 | 75 | 8 |
| 46 | 93 | 76 | 3 |
| 47 | 23 | 77 | 3 |
| 48 | 26 | 78 | 3 |
| 49 | 25 | 79 | 10 |
| 50 | 5 | 80 | 7 |
| 51 | 16 | 81 | 6 |
| 52 | 20 | 82 | 44 |
| 53 | 17 | 83 | 13 |
| 84 | 10 | 93 | 90 |
| 85 | 7 | 95 | 8 |
| 86 | 12 | 97 | 8 |
| 87 | 15 | 101 | 70 |
| 88 | 12 | 102 | 17 |
| 89 | 37 | 103 | 9 |
| 90 | 35 | 104 | 17 |
| 91 | 25 | 105 | 30 |
| 92 | 43 | 106 | 32 |

In all cases, a positive image of the original is produced after development with the Developer A used in Example 1.

EXAMPLE 5

Example 4 is repeated, except that instead of the novolak used in Example 1 the same quantity by weight of a phenolformaldehyde novolak is used which has a melting range of between 110° and 120° C. according to DIN 53181:

| Compound | Exposure Time (seconds) |
|---|---|
| 1 | 8 |
| 3 | 12 |

-continued

| Compound | Exposure Time (seconds) |
|---|---|
| 4 | 22 |
| 7 | 25 |
| 22 | 20 |
| 26 | 5 |
| 36 | 9 |
| 98 | 30 |
| 39 | 10 |

In these cases also, the copying compositions are positive-working.

EXAMPLE 6

An offset printing form is prepared as follows:

An electrolytically roughened and anodized aluminum foil is whirler coated (150 revolutions per minute) with the following coating solution:

94.6—p.b.w. of methyl ethyl ketone,
4.0—p.b.w. of the novolak used in Example 1,
1.2—p.b.w. of Compound No. 8,
0.2—p.b.w. of the acid donor No. 4 used in Example 1, and
0.01—p.b.w. of Crystal Violet.

The resulting layer has a dry weight of approximately 1.5 to 2.0 g/m². The dry light-sensitive material is exposed for 20 seconds under a positive combined line and screen original, using a 5 kW metal halide lamp at a distance of 110 cm. After exposure, an image becomes visible which shows a strong bluish-green contrast. Developer A of Example 1 is used for development. The exposed areas of the layer are dissolved away within 30 seconds and the blue-colored, unexposed areas remain as the printing stencil.

The offset printing plate prepared in this manner is inked with greasy ink in the normal manner and clamped on a printing machine. If the plate is to be stored, it may be wiped over with conventional preserver. After 110,000 prints, the printing run was stopped, although no damage to the 150 dot screen could be observed. The printing run can be considerably increased by after-heating the developed printing form at about 230° to 240° C.

EXAMPLE 7

In this example, the high thermal stability of the copying compositions according to the invention is shown by comparison with corresponding copying layers based on the monomeric bis-acetal compounds disclosed in U.S. Pat. No. 3,779,778. Sometimes, a lack of thermal stability becomes apparent as a reduction of the resistance to developers, i.e. by an insufficient differentiation between the exposed and unexposed areas of the layer during development. More frequently, however, poor thermal stability becomes apparent by a marked increase of the developing time required; in extreme cases, it is no longer possible to dissolve the exposed areas of the layer in the normally used developer. A severe thermal stress is regarded as a quick test of the storability of the material at room temperature or at moderately elevated temperature.

Aluminum plates with an electrolytically roughened and anodized surface are coated with an about 2 μm thick layer of the following composition:

73.8%—of the novolak used in Example 1,
22.3%—of monomeric or polymeric acetal,
3.7%—of the acid donor used in Example 2, and
0.2%—of Crystal Violet.

A 6 percent solution in methyl ethyl ketone is applied by whirler coating. All plates are heated equally long to 100° C. in a drier, exposed under an original, and then developed.

The following Table 7 shows the changes in the time required for development of the plates, as a function of the duration of thermal stress.

TABLE 7

| No. | Monomeric or polymeric acetal | Developer of Example 1 | a: Heating Period (minutes) b: Development (seconds) | | | | | | |
|---|---|---|---|---|---|---|---|---|---|
| | | | a | b | a | b | a | b | a | b |
| 1 | bisphenol-A-bis-tetrahydropyranyl-ether | B | 0 | 30 | 30 | 90 | 60 | 150 | 100 | 150 |
| 2 | di-(4-hydroxyphenyl)-sulfone-bis-tetrahydropyranyl-ethr. | B | 0 | 40 | 30 | 180 | 60 | 210 | 100 | 210 |
| 3 | Compound No. 8 | A | 0 | 40 | 30 | 40 | 60 | 40 | 100 | 40 |
| 4 | Compound No. 99 | A | 0 | 15 | 30 | 15 | 60 | 15 | 100 | 15 |

If, in the tests numbered 1 and 2, the Developer B according to Example 1 is replaced by the less aggressive Developer A, the times required for development will again increase considerably. Similar thermal stabilities are obtained if Compounds Nos. 19 or 9 are used instead of Compounds Nos. 8 or 99.

EXAMPLE 8

Aluminum plates with an electrolytically roughened and anodized surface are whirler coated with a solution comprising:

4.7—p.b.w. of the novolak used in Example 1,
1.4—p.b.w. of polymeric acetal,
0.23—p.b.w. of an acid donor,
0.02—p.b.w. of Crystal Violet, and
93.05—p.b.w. of butan-2-one in a manner such that the dried layers have a thickness of about 1.7 μm. The layers are imagewise irradiated over all spectral lines, using a 25 W argon-ion laser whose beam is optically focussed on a spot of 5 μm diameter. The sensitivity of the polyacetal/acid donor combinations is determined by modifying the recording speed of the laser. If the Developer A of Example 1 is used, the exposed areas of the layer are dissolved away within 15 to 90 seconds. The trace of the laser may be brought out even more clearly by inking the non-irradiated areas with greasy ink.

The following maximum recording speeds were observed:

| Combination | Recording Speed (m/sec.) |
|---|---|
| Compound No. 9 and 2,5-diethoxy-4-p-tolymercapto-benzene-diazonium hexafluophosphate | 100 |
| Compound No. 19 nd 2-(4-ethoxynaphth-1-yl)-4,6-bis-trichloromethyl-s-triazine | 75 |
| Compound No. 12 and 4-(4-methoxystyryl)-6-trichloromethyl-pyr-2-one | 45 |

EXAMPLE 9

This example shows the imaging by electron beams of the layers containing the new compounds capable of being split up by acids:

Layers of about 2 $\mu$m thickness of the following composition
74.0%—of the novolak used in Example 1,
22.0%—of polymeric acetal,
3.8%—of an initiator, and
0.2%—of a dyestuff,
applied to mechanically roughened aluminum are irradiated with 11 kV electrons, and the irradiated areas are solubilized under the conditions stated in Table 8.

TABLE 8

| Compound No. | Initiator | Irradiated Energy (Joule/cm$^2$) | Developer according to Example 1 | Developing Time (seconds) |
|---|---|---|---|---|
| 10 | 2-(p-Methoxystyryl)-4,6-bis-trichloromethyl-s-triazine | $1-5 \cdot 10^{-2}$ | A | 45 |
| 10 | 2,5-Diethoxy-4-p-tolylmercapto-benzene diazonium hexafluophosphate | $1-40 \cdot 10^{-1}$ | A | 45 |
| 12 | 2-(4-ethoxynaphth-1-yl)-4,6-bis-trichloromethyl-s-triazine | $1-15 \cdot 10^{-2}$ | B | 10 |
| 18 | 4-(2,4-Dimethoxy-styryl)-6-trichloromethyl-pyr-2-one | $1-15 \cdot 10^{-2}$ | A | 45 |
| 19 | 2,5-Diethoxy-4-p-tolyl-mercapto-benzene-diazonium hexafluophosphate | $1-15 \cdot 10^{-2}$ | B | 15 |

Similar results are obtained by using acid donors, such as pentabromoethane and tris-tribromomethyl-s-triazine, which absorb in the relatively short wave range of the spectrum, i.e. beyond the visible light range and outside of the main emission range of conventional light sources, but are highly active under electron radiation.

This process has the advantage that the layers may be handled under normal daylight.

EXAMPLE 10

A 25 $\mu$m thick, biaxially stretched and thermally fixed film of polyethylene terephthalate is immersed in an aqueous solution containing 10% of trichloro acetic acid, 1% of polyvinyl alcohol, and 0.1 percent of a wetting agent, and the film is then dried for 2 minutes at 140° C.

For the preparation of a positive-working dry resist layer, the thus pretreated polyester film is coated with a solution of
28.6—p.b.w. of the novolak used in Example 1,
8.6—p.b.w. of Compound No. 2,
0.5—p.b.w. of the acid donor used in Example 3,
2.1—p.b.w. of the coating auxiliary used in Example 2, and
0.2—p.b.w. of "C. I. Solvent Blue No. 16" as a dyestuff, dissolved in a mixture of 46 parts by weight of methyl ethyl ketone and 14 parts by weight of dioxane. After drying, the layer has a thickness of about 40 to 50 $\mu$m. In order to protect it against dust and scratching, the layer may be covered by a top coating of polyethylene.

After removal of the top coating, circuit boards may be prepared from this positive-working dry resist by laminating it in a commercial laminating device to a cleaned, previously heated support composed of an insulating material with copper layers of 35 $\mu$m thickness applied to one or both of its surfaces. After stripping the support film, possibly followed by drying, exposure under an original to a 5 kW metal-halide lamp (110 cm distance, about 100 seconds) and developing for about 2 to 4 minutes by spraying with the Developer A used in Example 1—to which a small quantity of n-butanol may be added—an imaged resist layer of high quality is obtained. It withstands not only the conditions prevailing during etching processes, using, e.g. FeCl$_3$, but is also resistant to electroplating processes used for the production of through-hole printed circuits, especially if layers of copper and nickel are electrodeposited after one another.

EXAMPLE 11

For the preparation of a re-enlargement plate,
4.0—p.b.w. of the novolak used in Example 1,
1.2—p.b.w. of Compound No. 10,
0.2—p.b.w. of 2-(4-ethoxynaphth-1-yl)-4,6-bistrichloromethyl-s-triazine, and
0.01—p.b.w. of Crystal Violet, are dissolved in
94.6—p.b.w. of methyl ethyl ketone, and the solution is whirler coated onto a brushed aluminum plate.

The resulting plate is exposed for 3 minutes under a positive transparency from a distance of 65 cm, using a projector sold by Messrs. Leitz (type Prado, f=85 mm, 1:25) equipped with a 150 watt lamp. By immersion in the Developer A stated in Example 1, an enlarged copy of the black and white line image on the positive transparency is obtained within 60 seconds, and the copy thus produced may be reproduced by printing in a small offset press.

Similar results are obtained if Compound No. 10 is replaced by equal quantities of Compounds Nos. 14, 19, 8, 38, 20, 94, or 99.

It will be obvious to those skilled in the art that many modifications may be made within the scope of the present invention without departing from the spirit thereof, and the invention includes all such modifications.

What is claimed is:

1. A positive-working radiation-sensitive copying composition which comprises
   (a) from about 0.1 to 10 percent by weight, based on the weight of the solids of the composition of a compound which forms an acid under the influence of actinic radiation, and (b) an organic polymeric compound which contains recurrent units corresponding to the general formula I:

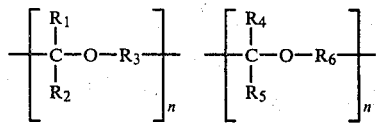

wherein
n—is an integer between 1 and 40,
$R_1$ and $R_4$ are H, alkyl or aryl groups,
$R_3$ and $R_6$ are alkylene oxy groups with at least two carbon atoms, and
$R_2$ and $R_5$ are alkyl or aryl groups, two of the groups $R_1$, $R_2$, and $R_3$, and two of the groups $R_4$, $R_5$, and $R_6$ may be combined to form a substituted or unsubstituted ring,
or
$R_3$ and $R_6$ are alkylene groups with at least two carbon atoms, and
$R_2$ and $R_5$ are alkoxy group which formed a substituted or unsubstituted ring with $R_3$ or $R_6$, and wherein
$R_3$ —may be combined with $R_4$ and $R_1$ may be combined with $R_6$ of the neighboring unit to form substituted or unsubstituted rings.

2. A copying composition according to claim 1 in which the polymeric compound contains recurrent units corresponding to the general formula IIa:

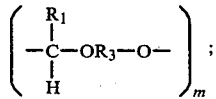

wherein
m—is an integer between 2 and 80,
$R_1$—is an alkyl or aryl group, and
$R_3$—is an alkylene group which may be combined with $R_1$ to form a substituted or unsubstituted ring.

3. A copying composition according to claim 1 in which the polymeric compound contains recurrent units corresponding to the general formula IIb:

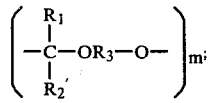

wherein
m—is an integer between 2 and 80,
$R_1$ and $R_2'$ are alkyl or aryl groups, and
$R_3$—is an alkylene group which may be combined with one of the groups $R_1$ and $R_2'$ to form a substituted or unsubstituted ring.

4. A copying composition according to claim 2 in which the polymeric compound contains recurrent units corresponding to the general formula III:

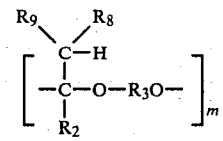

wherein
m—is an integer between 2 and 80,
$F_2$—is H, an alkyl or an aryl group,
$R_3$ —is an alkylene group and
$R_8$ and $R_9$ are H, alkyl or aryl groups which may be combined with each other or each of which may be combined with one of the groups $R_2$ and $R_3$ to form a substituted or unsubstituted ring.

5. A copying composition according to claim 1 in which the polymeric compound contains units corresponding to the general formula IV:

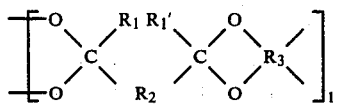

wherein
l—is an integer between 1 and 40,
$R_1$ and $R_1'$ are H, alkyl or aryl groups which may be combined with each other to form a possibly substituted ring,
$R_2$—is an alkylene or arylene group, and
$R_3$—is a 4-valent aliphatic group the free valences of which are attached to different carbon atoms at such distances that 5- or 6-membered rings result.

6. A copying composition according to claim 1 in which the main chain of the polymeric compound, on the average, contains at least three recurrent acetal or ketal groupings.

7. A copying composition according to claim 1 in which the alcohol constituent of the polymeric compound is an at least bivalent alcohol.

8. A copying composition according to claim 1 in which the alcoholic constituent of the polymeric compound contains between 2 and 18 carbon atoms.

9. A copying composition according to claim 1 in which the alcoholic constituent of the polymeric compound is derived from the hydroxy alkyl group of a hydroxy alkyl enol ether.

10. A copying composition according to claim 1 which additionally contains a polymeric binder.

11. A copying composition according to claim 1 in which the groups $R_3$ and $R_6$ are different from each other.

12. A copying composition according to claim 1 in which the groups $R_1$ and $R_4$ are different from each other.

13. A copying composition according to claim 1 in which the groups $R_2$ and $R_5$ are different from each other.

14. A process for the production of relief images which comprises imagewise exposing a positive-working recording layer, of a radiation-sensitive recording material comprising a support and a recording layer, to actinic radiation to an extent such that the solubility of the layer in an aqueous developer solution is increased, and removing the irradiated portions of the layer by means of an aqueous developer solution, said recording layer comprising
(a) from about 0.1 to 10 percent by weight, based on the weight of the solids of the composition of a compound which forms an acid under the influence of actinic radiation, and
(b) an organic polymeric compound which contains recurrent units corresponding to the general formula I:

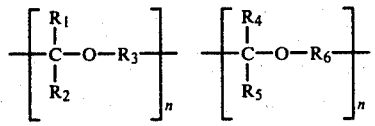

wherein n—is an integer between 1 and 40,
$R_1$ and $R_4$ are H, alkyl or aryl groups,
$R_3$ and $R_6$ are alkylene oxy groups with at least two carbon atoms, and
$R_2$ and $R_5$ are alkyl or aryl groups, two of the groups $R_1$, $R_2$ and $R_3$ and two of the groups $R_4$, $R_5$, and $R_6$ may be combined to form a substituted or unsubstituted ring,
$R_3$ and $R_6$—are alkylene groups with at least two carbon atoms, and
$R_2$ and $R_5$—are alkoxy groups which form a substituted or unsubstituted ring with $R_3$ or $R_6$, and wherein
$R_3$—may be combined with $R_4$ and $R_1$ may be combined with $R_6$ of the neighboring unit to form substituted or unsubstituted rings.

* * * * *

UNITED STATES PATENT AND TRADEMARK OFFICE
CERTIFICATE OF CORRECTION

PATENT NO. : 4,247,611

DATED : January 27, 1981

INVENTOR(S) : Jürgen Sander et al

It is certified that error appears in the above—identified patent and that said Letters Patent is hereby corrected as shown below:

Column 25, line 7, "nd" should read -- and --.

Column 27, line 66, after "claim 2" insert -- or 3 --.

Column 28, line 11, "$F_2$" should read -- $R_2$ --.

Signed and Sealed this

*Twenty-third* Day of *June 1981*

[SEAL]

*Attest:*

RENE D. TEGTMEYER

*Attesting Officer*     *Acting Commissioner of Patents and Trademarks*